(12) United States Patent
Huang et al.

(10) Patent No.: US 8,080,877 B2
(45) Date of Patent: Dec. 20, 2011

(54) DAMASCENE INTERCONNECTION STRUCTURE AND DUAL DAMASCENE PROCESS THEREOF

(75) Inventors: Chun-Jen Huang, Tainan Hsien (TW);
Yu-Tsung Lai, Tai-Chung Hsien (TW);
Jyh-Cherng Yau, Tai-Nan (TW);
Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/821,136

(22) Filed: Jun. 23, 2010

(65) Prior Publication Data
US 2010/0258941 A1    Oct. 14, 2010

Related U.S. Application Data

(62) Division of application No. 11/621,996, filed on Jan. 11, 2007, now Pat. No. 7,767,578.

(51) Int. Cl.
*H01L 23/48* (2006.01)
*H01L 23/52* (2006.01)
*H01L 29/40* (2006.01)

(52) U.S. Cl. .......... 257/758; 257/E23.145; 257/E21.579

(58) Field of Classification Search .................. 257/758, 257/773, E21.579, E21.252, E21.257, 760, 257/762, 759, 211, E23.167, E23.152, E21.641, 257/E23.145, E23.151, E23.16; 438/739, 438/740, 623, 622

See application file for complete search history.

(56) References Cited

U.S. PATENT DOCUMENTS

| | | | |
|---|---|---|---|
| 5,981,377 A * | 11/1999 | Koyama | 438/633 |
| 6,312,874 B1 | 11/2001 | Chan | |
| 6,905,968 B2 | 6/2005 | Hsieh | |
| 6,930,048 B1 | 8/2005 | Li et al. | |
| 7,019,400 B2 * | 3/2006 | Iguchi et al. | 257/758 |
| 7,226,853 B2 | 6/2007 | Bekiaris | |
| 7,612,453 B2 * | 11/2009 | Usami | 257/758 |
| 2003/0068582 A1 | 4/2003 | Komada | |
| 2004/0157442 A1 * | 8/2004 | Cowley et al. | 438/687 |
| 2004/0245636 A1 | 12/2004 | Cooney | |
| 2005/0037605 A1 | 2/2005 | Kim | |
| 2005/0082089 A1 * | 4/2005 | Grunow et al. | 174/266 |
| 2005/0106888 A1 | 5/2005 | Chiu | |
| 2005/0186782 A1 | 8/2005 | Burke | |

(Continued)

FOREIGN PATENT DOCUMENTS

CN       1411050 A       4/2003

(Continued)

*Primary Examiner* — David S Blum
*Assistant Examiner* — Latanya N Crawford
(74) *Attorney, Agent, or Firm* — Winston Hsu; Scott Margo

(57) ABSTRACT

A dual damascene process is disclosed. A substrate having a base dielectric layer, a lower wiring layer inlaid in the base dielectric layer, and a cap layer capping the lower wiring layer is provided. A dielectric layer is deposited on the cap layer. A silicon oxide layer is deposited on the dielectric layer. A metal hard mask is formed on the silicon oxide layer. A trench opening is etched into the metal hard mask. A partial via feature is etched into the dielectric layer within the trench opening. The trench opening and the partial via feature are etch transferred into the dielectric layer, thereby forming a dual damascene opening, which exposes a portion of the cap layer. A liner removal step is performed to selectively remove the exposed cap layer from the dual damascene opening by employing $CF_4/NF_3$ plasma.

8 Claims, 19 Drawing Sheets

U.S. PATENT DOCUMENTS

| | | |
|---|---|---|
| 2005/0245041 A1 | 11/2005 | Frohberg |
| 2005/0280152 A1* | 12/2005 | Fitzsimmons et al. ........ 257/750 |
| 2006/0055046 A1* | 3/2006 | Kanamura .................... 257/758 |
| 2006/0237853 A1 | 10/2006 | Nogami |
| 2007/0049012 A1 | 3/2007 | Huang |
| 2007/0222076 A1 | 9/2007 | Fukasawa |
| 2007/0224824 A1* | 9/2007 | Chen et al. .................... 438/700 |
| 2007/0232048 A1 | 10/2007 | Miyata |
| 2007/0254476 A1 | 11/2007 | Chou |
| 2007/0267751 A1* | 11/2007 | Yang et al. .................... 257/758 |
| 2008/0122090 A1* | 5/2008 | Hsu et al. ...................... 257/746 |

FOREIGN PATENT DOCUMENTS

| | | |
|---|---|---|
| CN | 1618121 A | 5/2005 |

* cited by examiner

DAMASCENE INTERCONNECTION STRUCTURE AND DUAL DAMASCENE PROCESS THEREOF

CROSS REFERENCE TO RELATED APPLICATIONS

This application is a division of U.S. application Ser. No. 11/621,996 filed Jan. 11, 2007.

BACKGROUND OF THE INVENTION

1. Field of the Invention

The present invention relates generally to copper interconnects and semiconductor manufacturing process. More particularly, the present invention relates to an improved copper dual damascene process, which is particularly suited for a copper dual damascene process utilizing a metal hard mask and is capable of solving undesired recess defects near a lower wiring layer caused by misalignment between a via hole and the lower wiring layer. The aforesaid recess defect is etched through a capping layer that caps the lower wiring layer and into a low-k dielectric layer that encapsulates the lower wiring layer.

2. Description of the Prior Art

Damascene interconnect processes incorporated with copper are known in the art, which are also referred to as "copper damascene processes" in the semiconductor industry. The copper damascene processes provide a solution to form a conductive wire coupled with an integral via plug without the need of dry etching copper. Either a single damascene or a dual damascene structure is used to connect devices and/or wires of an integrated circuit. Generally, the dual damascene process encompasses trench-first, via-first, partial-via-first, and self-aligned processes.

FIGS. 1-5 are schematic, cross-sectional diagrams showing a conventional partial-via-first dual damascene process. As shown in FIG. 1, a substrate 1 having thereon a base layer or a lower low-k dielectric layer 10 is provided. A lower copper wiring 12 is inlaid into the lower low-k dielectric layer 10. The lower copper wiring 12 and the low-k dielectric layer 10 are covered with a lower cap layer 14. A low-k dielectric layer 16, a silicon oxide cap layer 18, a metal hard mask layer 20 and a bottom anti-reflective coating (BARC) layer 22 are sequentially deposited on the lower cap layer 14. A layer of photoresist (Trench Photo) 30 having a trench opening 32 therein is formed on the BARC layer 22.

Subsequently, as shown in FIG. 2, a dry etching process is carried out. A trench recess 36 is etched into the metal hard mask layer 20 and the silicon oxide cap layer 18 through the trench opening 32. The dry etching stops on the silicon oxide cap layer 18. The remaining photoresist 30 and BARC layer 22 are then stripped off.

As shown in FIG. 3, another BARC layer 38 is coated over the substrate 1 and fills the trench recess 36. A layer of photoresist (Via Photo) 40 is then formed on the BARC layer 38. The photoresist layer 40 has a via opening 42 patterned by using conventional lithographic methods. The via opening 42 is situated directly above the trench recess 36.

Thereafter, using the photoresist layer 40 as an etching hard mask, the BARC layer 38, the silicon oxide cap layer 18, and the lower low-k dielectric layer 16 are etched through the via opening 42, thereby forming a partial via feature 46 in an upper portion of the dielectric layer 16. As shown in FIG. 4, the remaining photoresist layer 40 and the BARC layer 38 are stripped off by using oxygen plasma, thereby exposing the remaining metal hard mask layer 20.

As shown in FIG. 5, using the metal hard mask layer 20 as an etching hard mask, a dry etching is performed to etch away the exposed silicon oxide cap layer 18 and the lower low-k dielectric layer 16 simultaneously through the trench recess 36 and the partial via 46, thereby forming a dual damascene opening 50 comprising a trench opening 56 and a via opening 66. This dry etching stops on the lower cap layer 14.

As shown in FIG. 6, a so-called liner removal step or LRM step is carried out to remove the exposed lower cap layer 14 from the via opening 66, thereby exposing the lower copper wiring 12. The subsequent steps for forming an upper damascene wiring structure including, for example, deposition of barrier and plating of copper are known in the art and are therefore omitted. The aforesaid LRM step usually uses a plasma source comprising hydrogen-containing carbon fluoride such as $CH_2F_2$ or $CHF_3$.

However, as the critical dimensions of semiconductor integrated circuit devices shrink, the misalignment between the via opening 66 of the dual damascene opening 50 and the lower copper wiring 12 becomes worse. As shown in FIG. 7 and FIG. 8, when misalignment occurs, the low-k dielectric layer 10 that encapsulates the lower copper wiring 12 is recess etched in the aforesaid LRM step after the overlying cap layer 14 is etched through. Therefore, an undesired recess defect 80 forms next to the lower copper wiring 12. Such recess defect 80 becomes problematic when performing the following barrier deposition because the barrier cannot uniformly deposit into the recess defect 80, thus adversely affecting the performance and reliability of the semiconductor integrated circuit devices. Another drawback is that the use of hydrogen-containing carbon fluoride such as $CH_2F_2$ or $CHF_3$ in the aforesaid LRM step results in residues that are difficult to be removed. It is believed that such residues include organic meal substances derived from the plasma gas and the metal hard mask.

U.S. Pat. No. 6,905,968 discloses a process for selectively etching dielectric structure comprising a lower layer of undoped silicon oxide or F-doped silicon oxide and an upper layer of C, H-doped silicon oxide (k=2.5~3) in order to avoid the use of an etch stop layer between the lower layer and the upper layer. The dielectric structure is etched in a plasma-etching step, which plasma-etching step is conducted using a plasma source gas that comprises nitrogen atoms and fluorine atoms. The plasma source gas can comprise a gaseous species that comprises one or more nitrogen atoms and one or more fluorine atoms (e.g., $NF_3$). The plasma source gas can comprise (a) a gaseous species that comprises one or more nitrogen atoms (e.g., $N_2$) and (b) a gaseous species that comprises one or more fluorine atoms (e.g., a fluorocarbon gas such as $CF_4$). U.S. Pat. No. 6,905,968 teaches that the cap layer exposed by the via opening is removed by using $CH_2F_2$ or $CHF_3$ plasma.

In light of the above, there is a need in this industry to provide an improved method of forming dual damascene structure in the fabrication of integrated circuits, which is capable of solving the aforesaid problems.

SUMMARY OF THE INVENTION

It is one object of the present invention to provide an improved copper dual damascene method, which is capable solving the above-described problems.

It is one object of the present invention to provide an improved copper dual damascene method to address the misalignment between the via opening and the lower copper wiring.

According to the claimed invention, a damascene process is provided. A substrate comprises a base dielectric layer, a lower wiring layer inlaid in the base dielectric layer, and a cap layer capping the lower wiring layer and the base dielectric layer. A dielectric layer is deposited on the cap layer. An opening is etched into the dielectric layer to expose a portion of the cap layer. A liner removal step is performed by employing $CF_4/NF_3$ plasma to selectively remove the exposed cap layer from the opening, thereby revealing a portion of the lower wiring layer and a portion of the base dielectric layer, wherein at bottom of the opening, a step height between the exposed base dielectric layer and exposed top surface of the lower wiring layer is less than 150 angstroms.

According to the claimed invention, a dual damascene process is disclosed. A substrate comprising a base dielectric layer, a lower wiring layer inlaid in the base dielectric layer, and a cap layer capping the lower wiring layer is provided. A dielectric layer is deposited on the cap layer. A silicon oxide layer is then deposited on the dielectric layer. A metal hard mask is formed on the silicon oxide layer. A trench opening is etched into the metal hard mask and the silicon oxide layer. A partial via feature is etched into the dielectric layer within the trench opening, wherein the partial via opening misaligns with the lower wiring layer. The trench opening and the partial via feature are etch transferred into the dielectric layer, thereby forming a dual damascene opening therein, which exposes a portion of the cap layer. A liner removal step is performed to selectively remove the exposed cap layer from the dual damascene opening by employing $CF_4/NF_3$ plasma, thereby revealing a portion of the lower wiring layer and a portion of the base dielectric layer.

From one aspect of this invention, a dual damascene process is disclosed. A substrate comprising a base dielectric layer, a lower wiring layer inlaid in the base dielectric layer, and a cap layer capping the lower wiring layer is provided. A dielectric layer is deposited on the cap layer. A silicon oxide layer is deposited on the dielectric layer. A metal hard mask is formed on the silicon oxide layer. A trench opening is etched into the metal hard mask. A via opening is etched into the dielectric layer through the trench opening to expose a portion of the cap layer. A liner removal step is performed to selectively remove the exposed cap layer from the via opening by employing a plasma source comprising hydrogen-free carbon fluoride and nitrogen-containing gas, thereby revealing a portion of the lower wiring layer and a portion of the base dielectric layer.

From another aspect of this invention, a dual damascene structure is provided. The dual damascene structure includes a substrate comprising thereon a base dielectric layer; a lower wiring layer inlaid in the base dielectric layer; a cap layer capping the lower wiring layer and the base dielectric layer; a dielectric layer on the cap layer; a via opening in the dielectric layer and the cap layer, wherein the via opening misaligns with the lower wiring layer thus exposing a portion of the lower wiring layer and a portion of the base dielectric layer; a barrier layer lining interior surface of the via opening and covers the exposed lower wiring layer and the base dielectric layer; and a copper layer filling the via opening on the barrier layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 9-17 are schematic, cross-sectional diagrams showing a dual damascene process according to one preferred embodiment of this invention, wherein like numeral numbers designate like elements, regions or layers. It is understood that the present invention is not limited to the embodiments illustrated in FIGS. 9-17. The present invention is suited for other types of damascene process such as trench-first damascene, via-first damascene or partial via-first damascene processes, among others.

Figure 9:
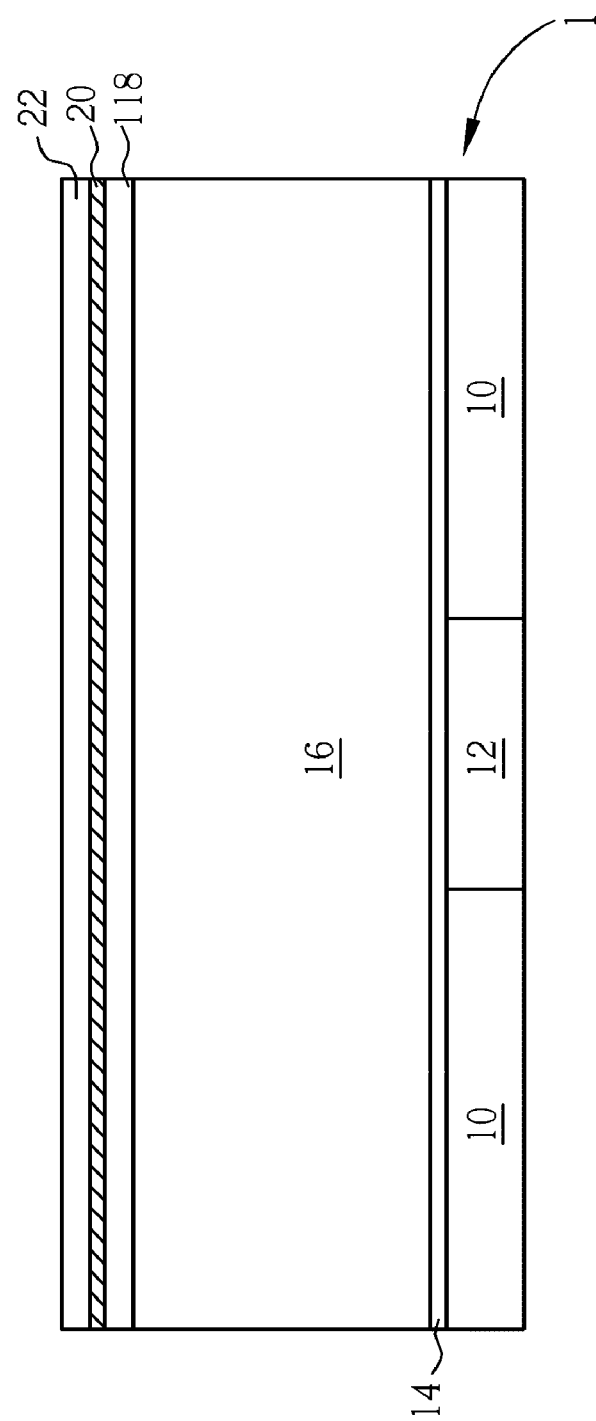
FIGS. 9-17 are schematic, cross-sectional diagrams showing a dual damascene process in accordance with one preferred embodiment of this invention.
Figure 10:
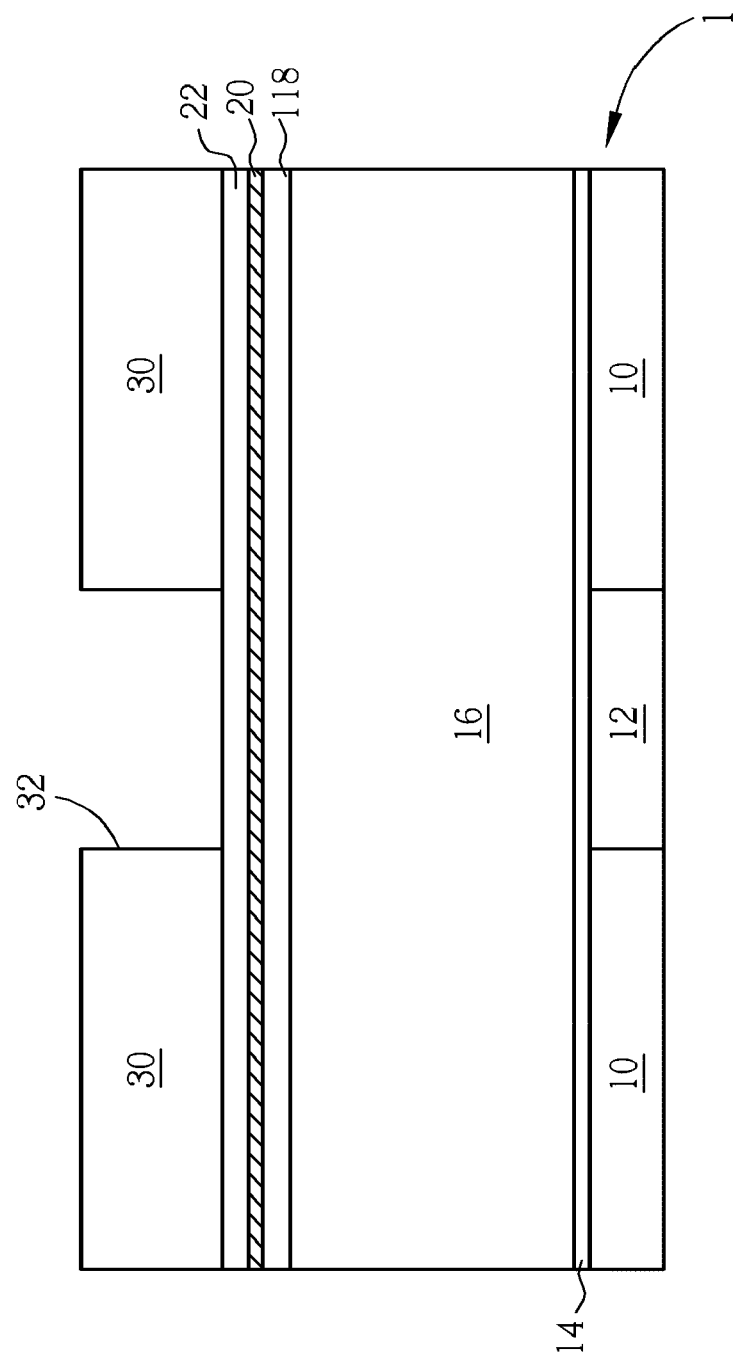

As shown in FIG. 9, a substrate 1 having thereon a base layer or a lower low-k dielectric layer 10 is provided. Likewise, a lower copper wiring 12 is inlaid into the lower low-k dielectric layer 10. The lower copper wiring 12 and the low-k dielectric layer 10 are covered with a lower cap layer 14. According to the preferred embodiment, the lower cap layer 14 is made, for example, of nitrogen doped silicon carbide (SiCN) and has a thickness of about 300-800 angstroms, preferably about 500 angstroms. The lower cap layer 14 may be made of other materials such as silicon nitride, silicon oxy-nitride, silicon carbide, oxygen-doped silicon carbide (SiCO), etc.

Subsequently, a low-k dielectric layer 16, a TEOS-based silicon oxide cap layer 118, a metal hard mask layer 20 and a bottom anti-reflective coating (BARC) layer 22 are sequentially deposited on the lower cap layer 14. Preferably, the metal hard mask layer 20 is made of titanium nitride (TiN), but not limited thereto. For example, the metal hard mask layer 20 may be made of tantalum nitride (TaN) or other suitable metals or alloys. According to the preferred embodiment, the thickness of the metal hard mask layer 20 ranges between 250-450 angstroms, preferably about 300-350 angstroms.

The low-k dielectric layers 10 and 16 may include organosilicate glass (OSG), which is a silicon oxide that is doped with carbon and hydrogen atoms and has a dielectric constant (k) value between 2 and 3, thereby providing a needed reduction in capacitance coupling between wirings. Suitable low-k materials for the low-k dielectric layers 10 and 16 may include, for example, Black Diamond™ available from Applied Materials, CORAL™ available from Novellus, among others. According to the preferred embodiment, the thickness of the low-k dielectric layer 16 ranges between 2500-4500 angstroms, preferably about 3000-3500 angstroms.

According to the preferred embodiment, the TEOS-based silicon oxide cap layer 118 is deposited by using a plasmaenhanced chemical vapor deposition (PECVD) method, wherein tetraethylorthosilicate precursor, oxygen ($O_2$) and a relatively higher $O_2$/TEOS ratio are employed.

According to the preferred embodiment, the TEOS-based silicon oxide cap layer 118 having a reduced carbon content is deposited by employing the following process conditions: a pressure of about 3-8 Torr, preferably 5 Torr; a process temperature of about 100-450° C., preferably 350-400° C.; a high-frequency RF power of about 200-350 Watts, preferably 250-300 Watts, more preferably 280 Watts, for a duration of about 25 seconds; a low-frequency RF power (bias RF power) of about 30-70 Watts, preferably 40-60 Watts, more preferably about 50 Watts; TEOS precursor of about 0.2-5 gm; helium (carrier gas) flowrate of about 7500-9500 sccm, preferably 8500-9000 sccm; and oxygen ($O_2$) flowrate of about 5000-10000 sccm, preferably about 8000 sccm. The above-described PECVD process is carried out at relatively low deposition rate ranging between 800-4000 angstroms/minute. The TEOS-based silicon oxide cap layer 118 has a thickness of about 300-1000 angstroms, preferably 500 angstroms.

Figure 1:
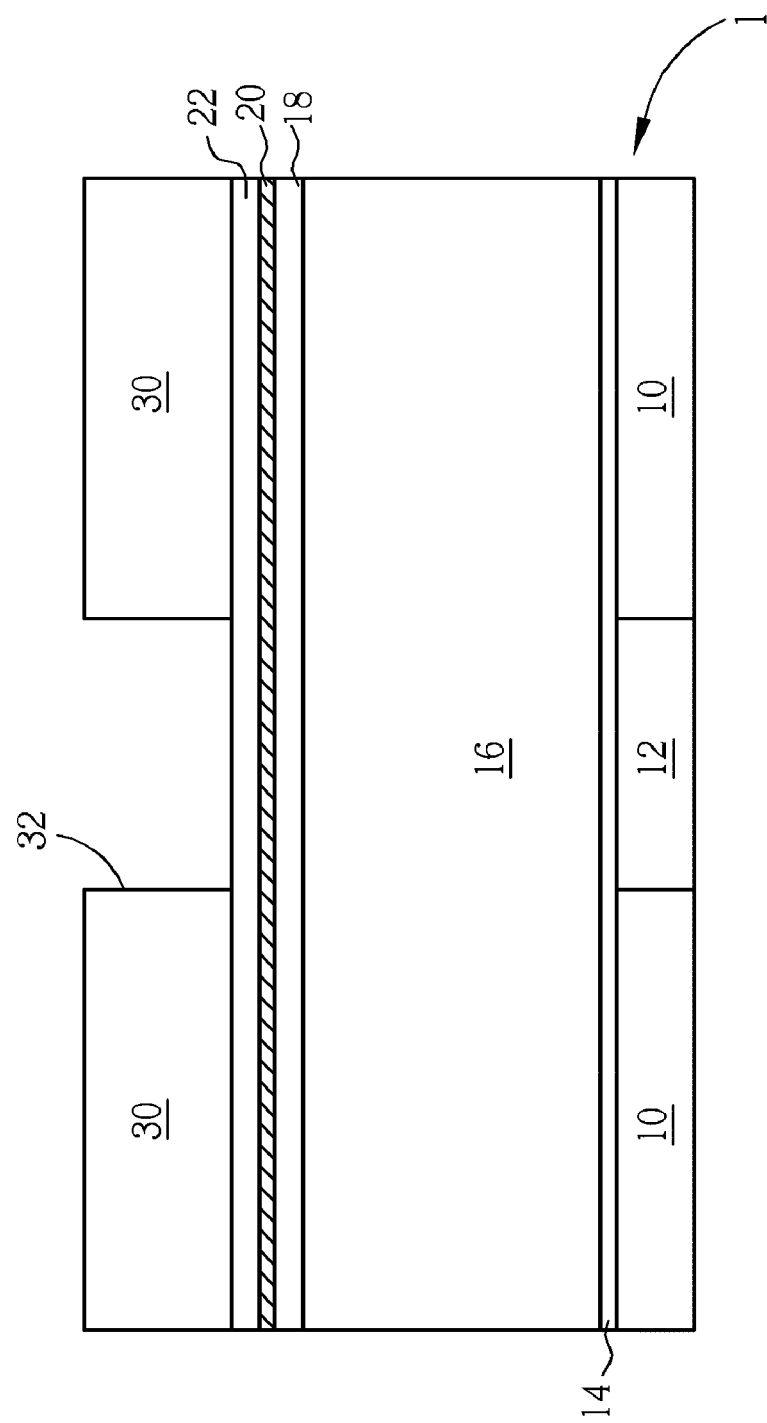
FIGS. 1-6 are schematic, cross-sectional diagrams showing a conventional partial-via-first dual damascene process.
Figure 2:
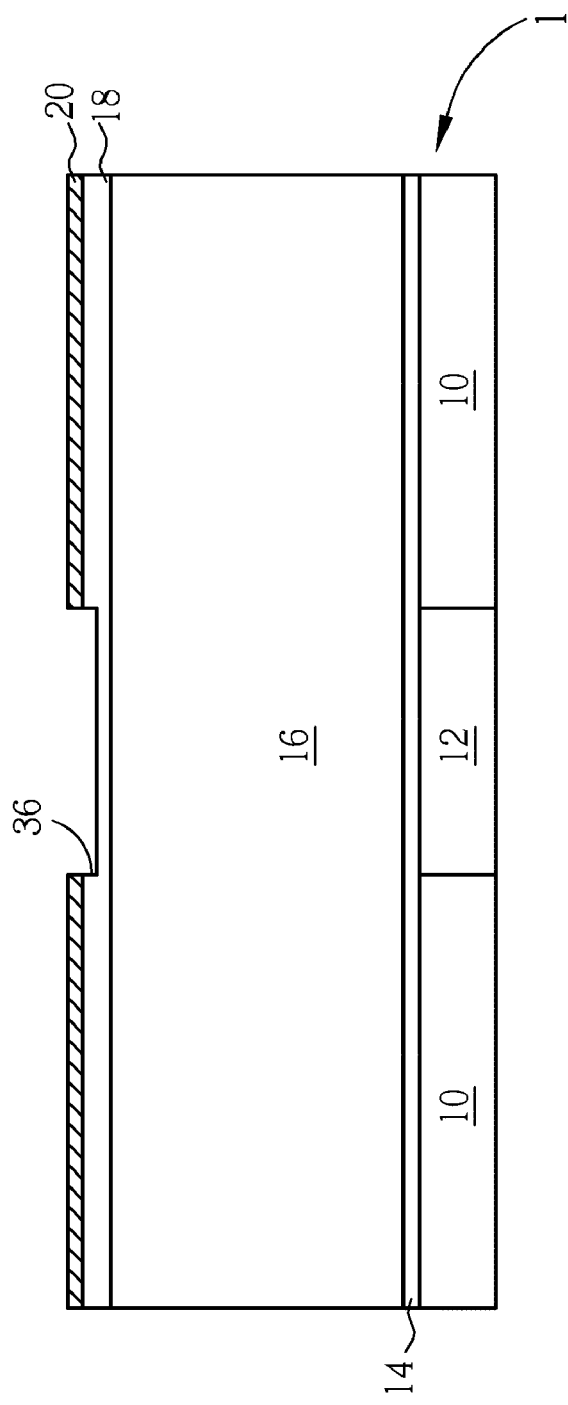
Figure 3:
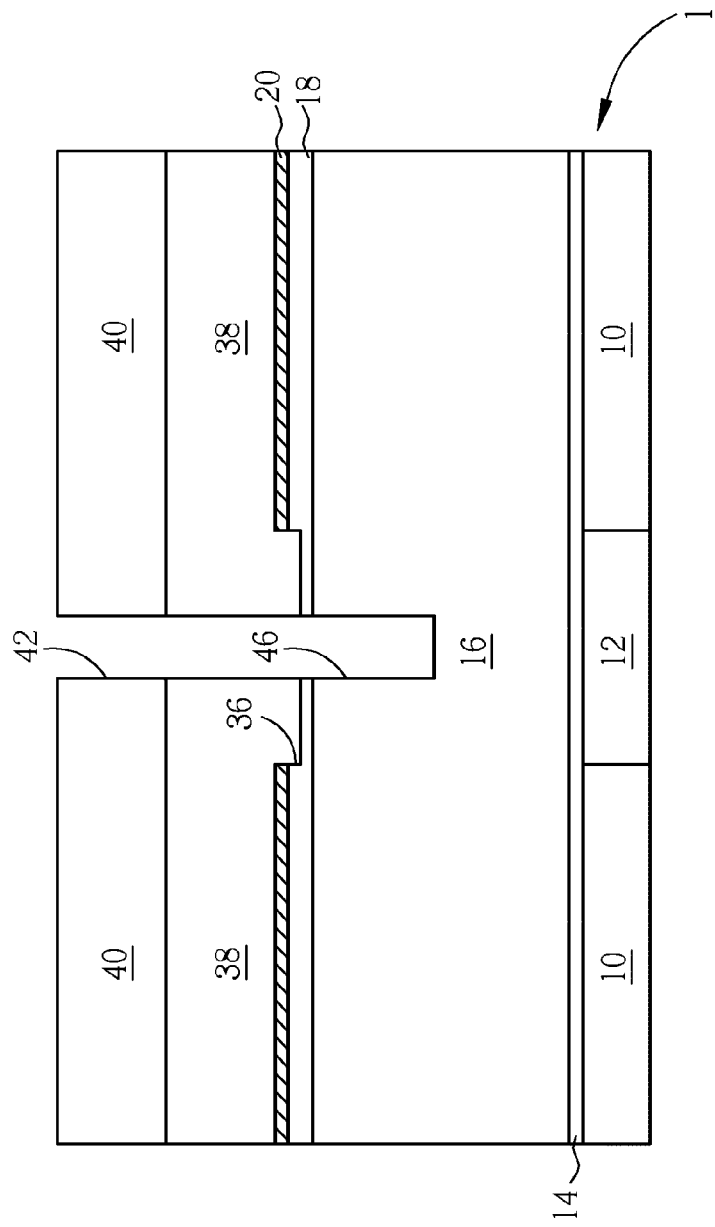
Figure 4:
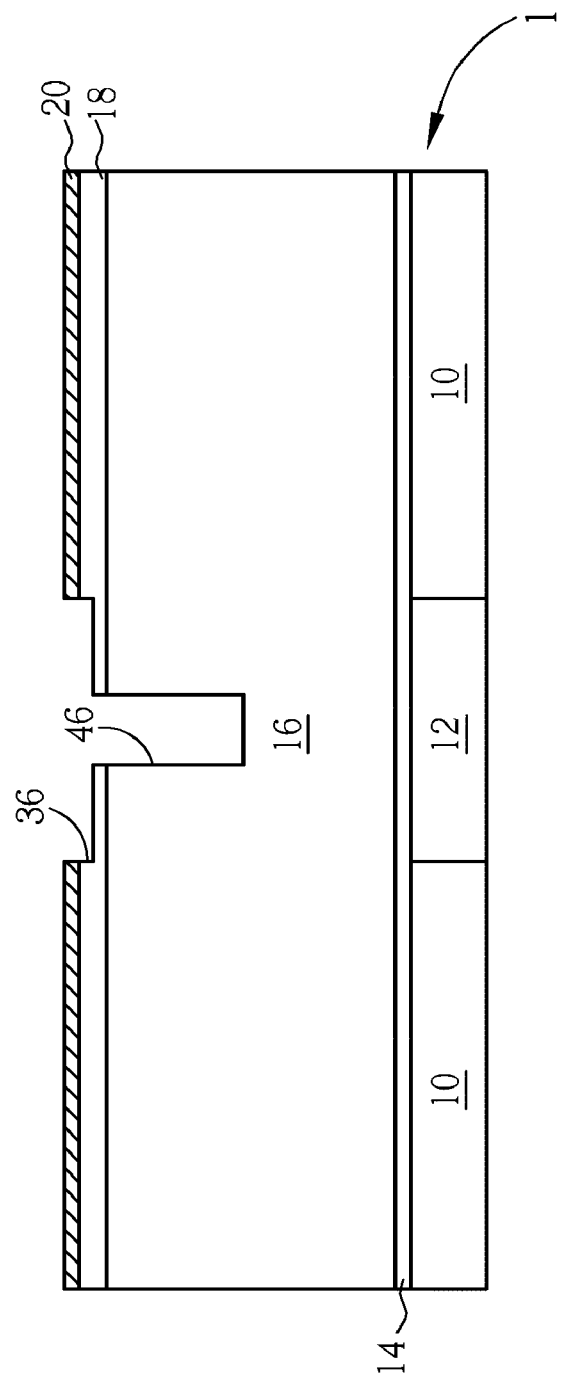
Figure 5:
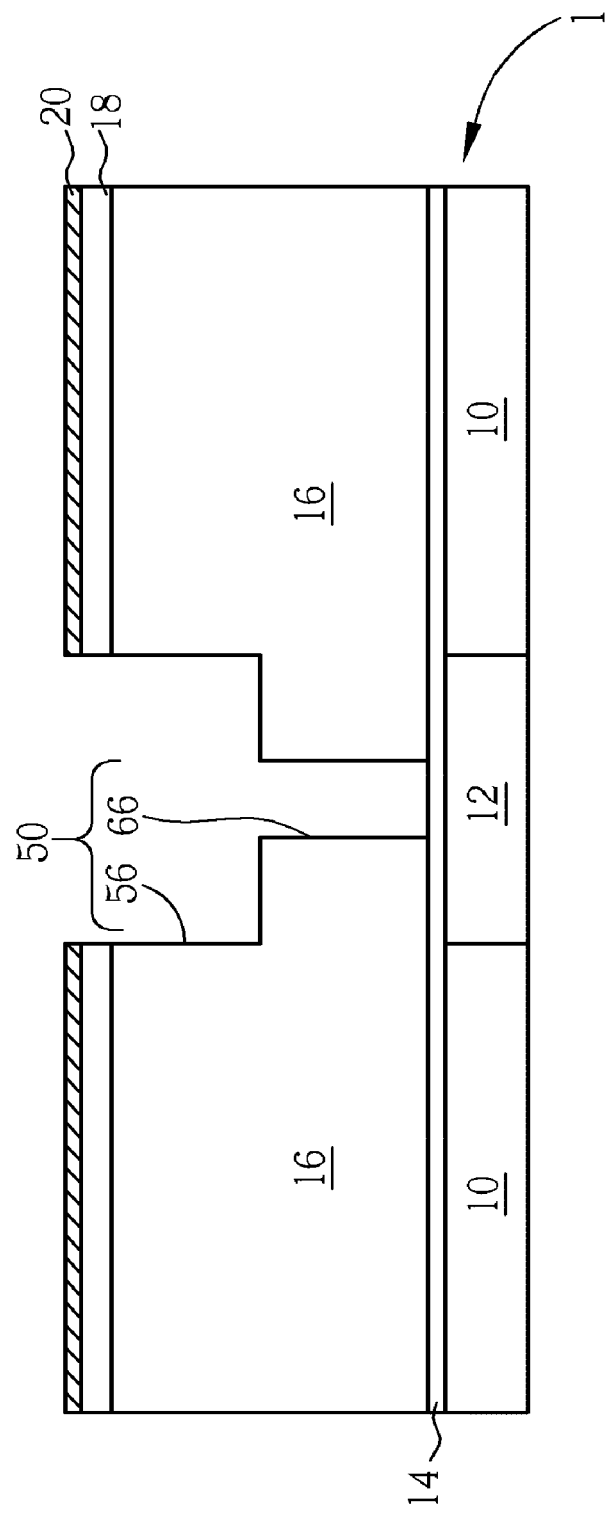
Figure 6:
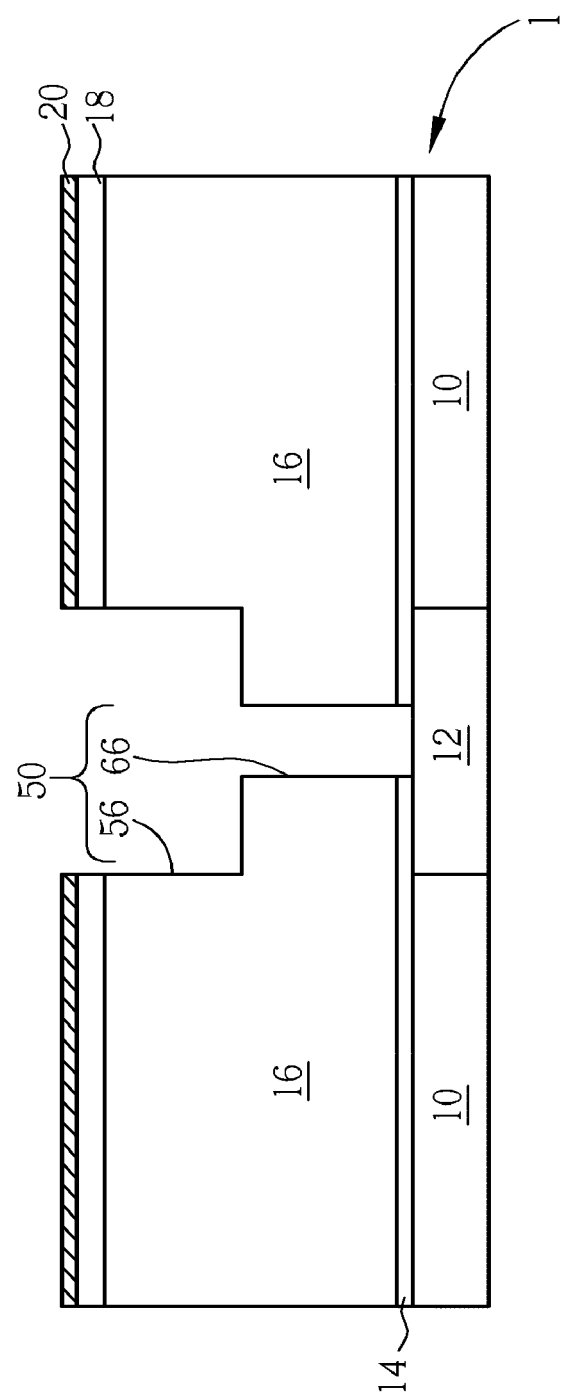
Figure 7:
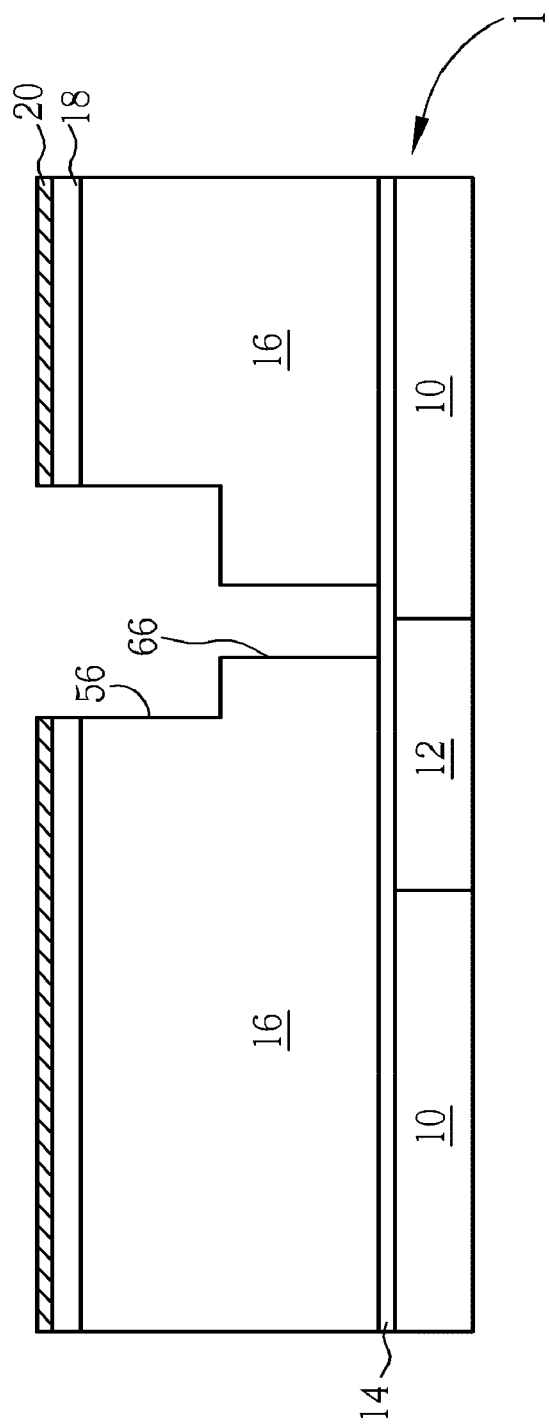
FIGS. 7-8 are schematic, cross-sectional diagrams showing misalignment between via opening and the lower copper wiring and recess defect.
Figure 8:
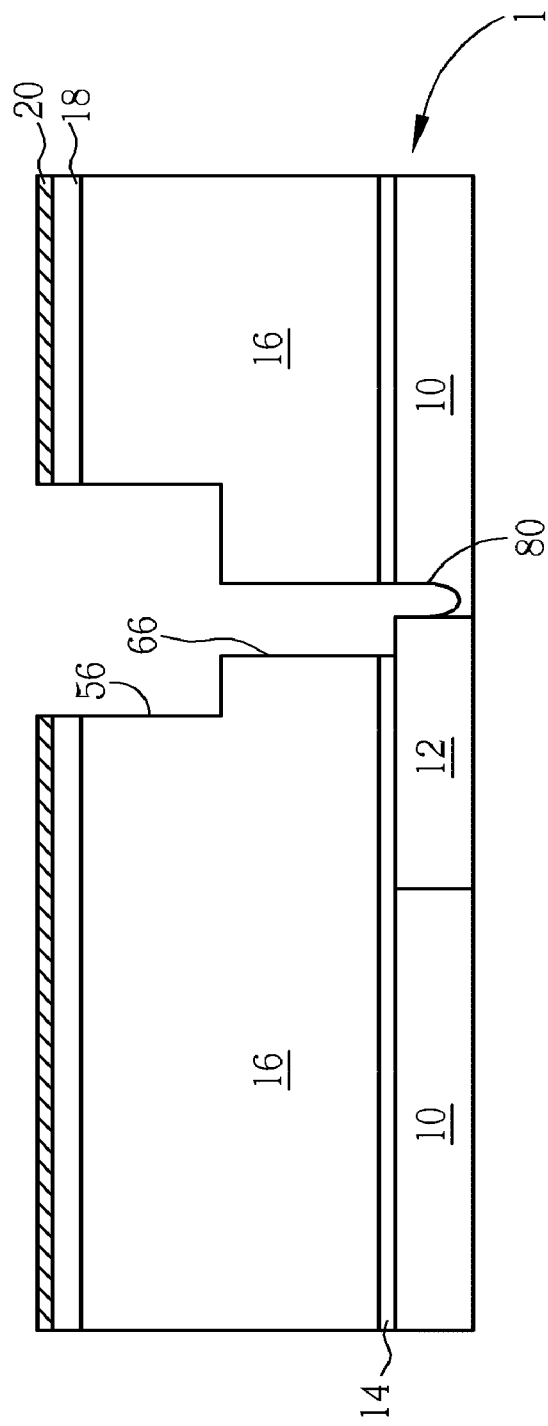

As shown in FIG. 7, a layer of photoresist (Trench Photo) 30 having a trench opening 32 therein is formed on the BARC layer 22. The trench opening 32 defines the damascened wiring trench pattern to be etched into the underlying low-k dielectric layer 16.

Figure 11:
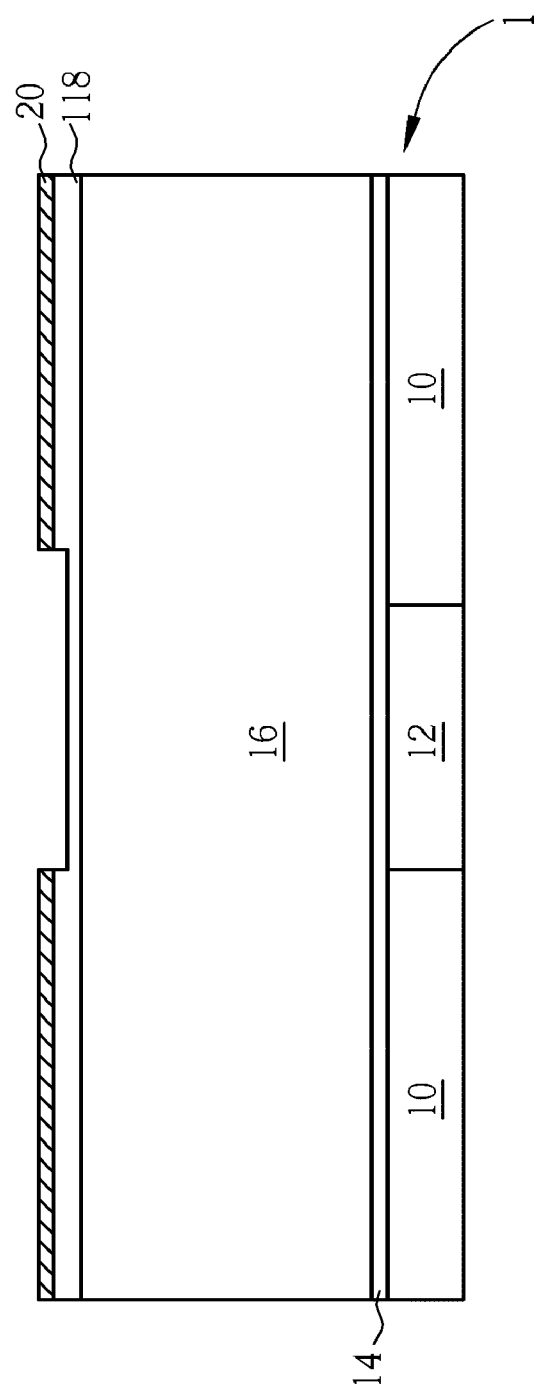

Subsequently, as shown in FIG. 11, a dry etching process is carried out. A trench recess 36 is etched into the metal hard mask layer 20 and the TEOS-based silicon oxide cap layer 118 through the trench opening 32. The dry etching stops on the TEOS-based silicon oxide cap layer 118. The remaining photoresist 30 and BARC layer 22 are then stripped off. The photoresist 30 may be stripped with an oxygen containing plasma.

Figure 12:
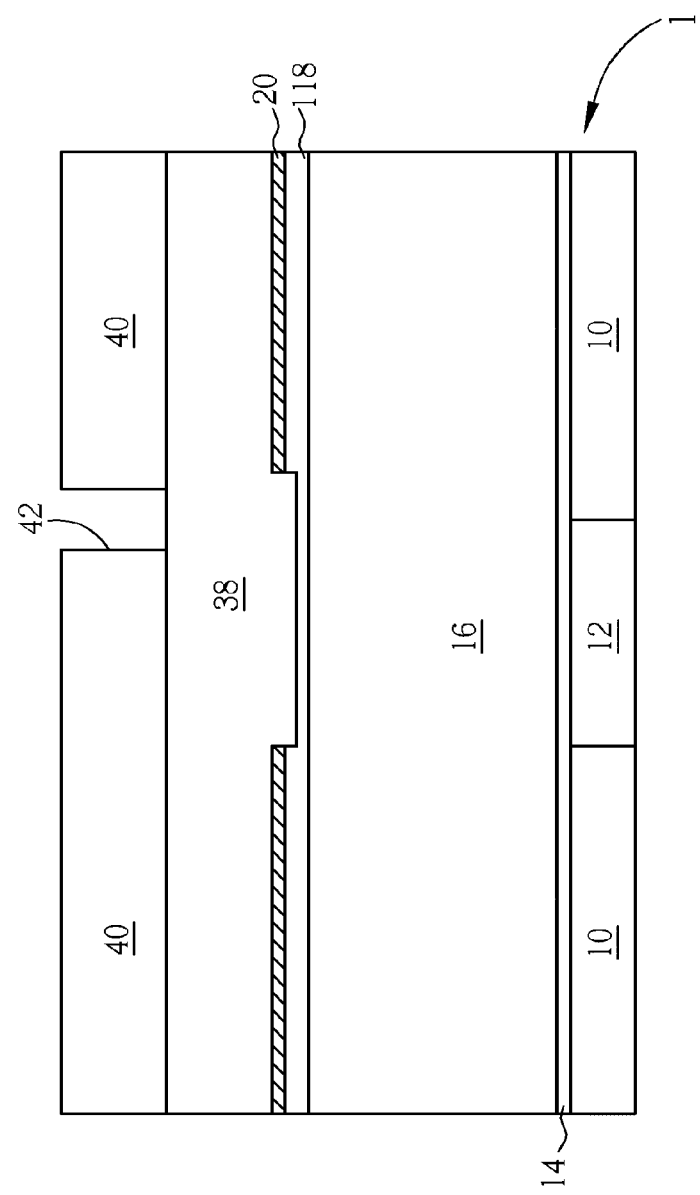

As shown in FIG. 12, another BARC layer 38 is coated over the substrate 1 and fills the trench recess 36. A layer of photoresist (Via Photo) 40 is then formed on the BARC layer 38. The photoresist layer 40 has a via opening 42 patterned by using conventional lithographic methods. The via opening 42 is situated directly above the trench recess 36, but is misaligned with the lower copper wiring 12.

Figure 13:
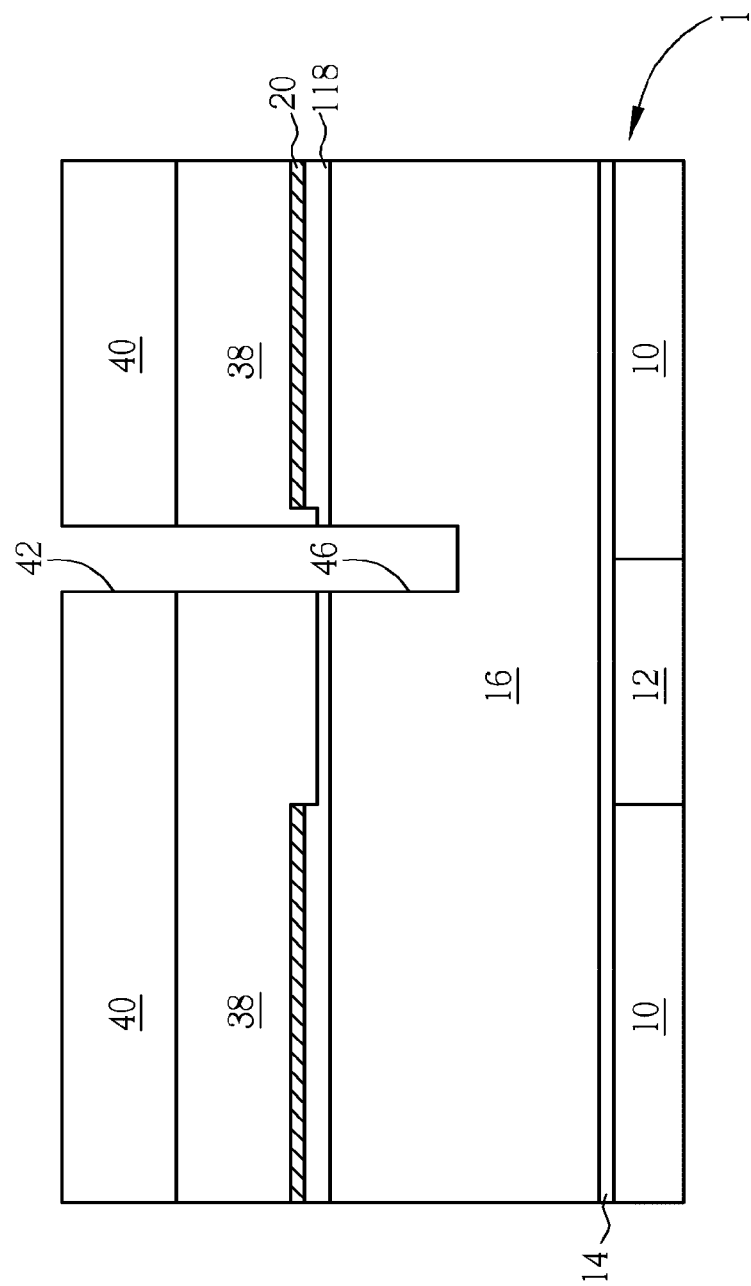

As shown in FIG. 13, using the photoresist layer 40 as an etching hard mask, the BARC layer 38, the TEOS-based silicon oxide cap layer 118, and the lower low-k dielectric layer 16 are etched through the via opening 42, thereby forming a partial via feature 46 in an upper portion of the low-k dielectric layer 16.

Figure 14:
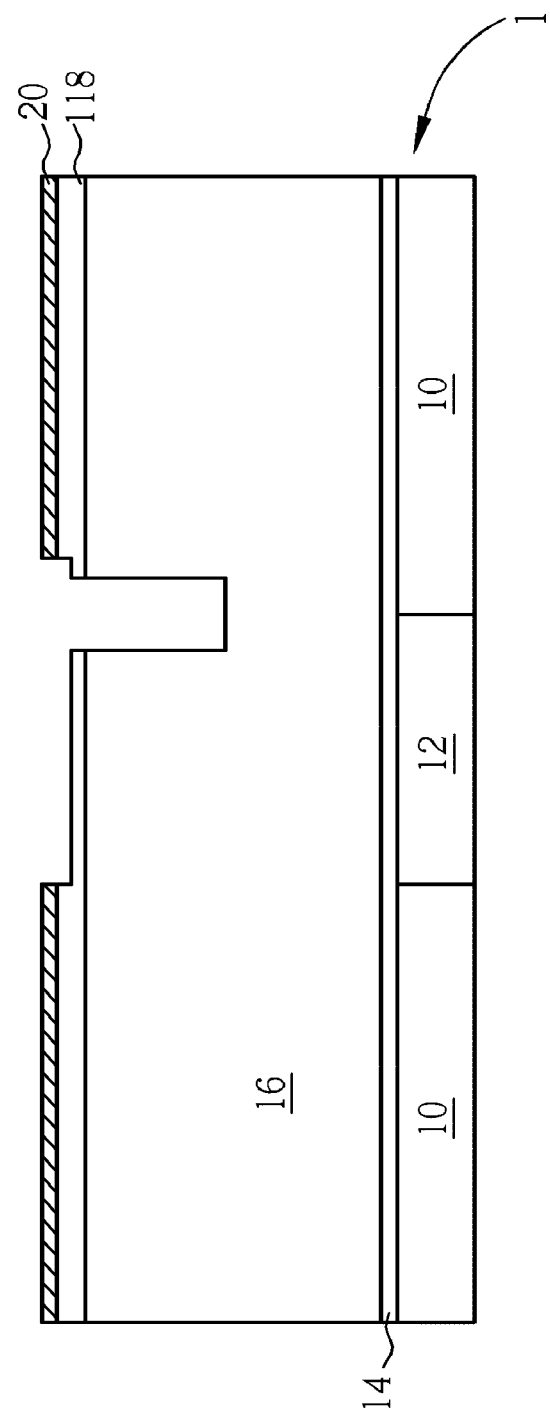

As shown in FIG. 14, the remaining photoresist layer 40 and the BARC layer 38 are stripped off by using oxygen plasma. Alternatively, $H_2/N_2$ or $H_2$/He plasma may be employed to strip the photoresist layer 40 and the BARC layer 38.

Figure 15:
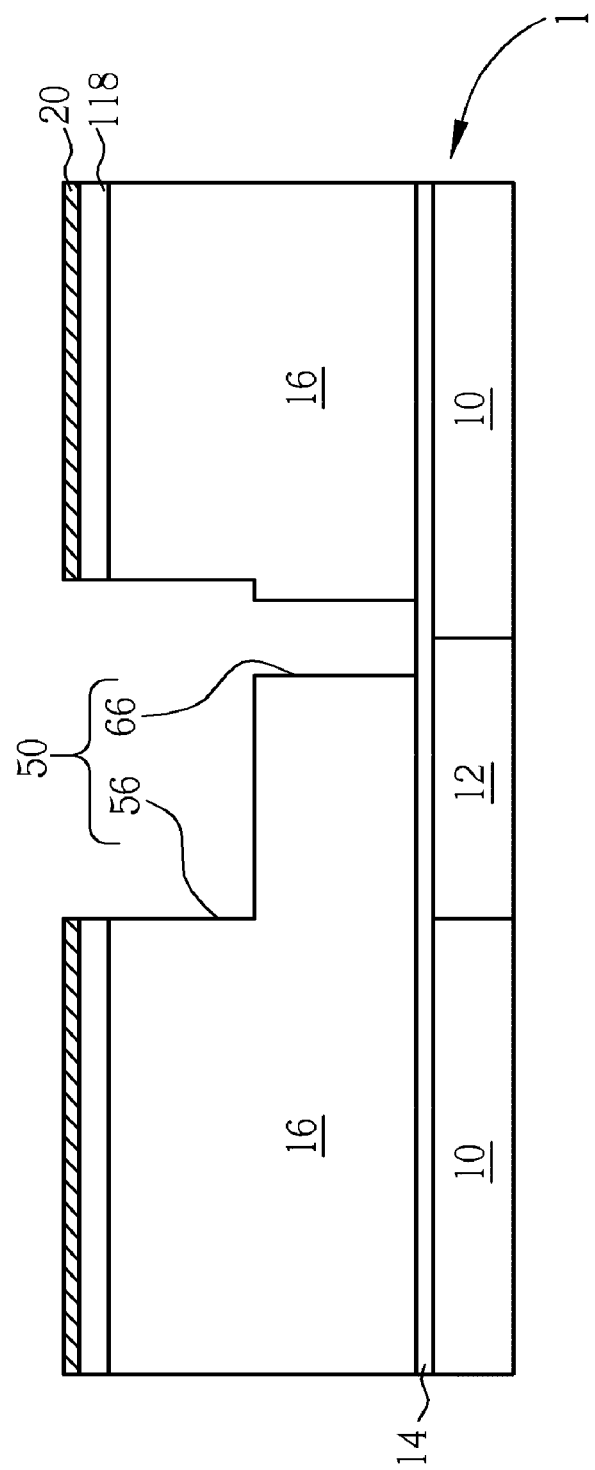

As shown in FIG. 15, using the metal hard mask layer 20 as an etching hard mask, a dry etching is performed to etch away the exposed TEOS-based silicon oxide cap layer 118 and the lower low-k dielectric layer 16 through the trench recess 36 and the partial via 46, thereby forming a dual damascene opening 50 comprising a trench opening 56 and a via opening 66 that exposes portion of the lower cap layer 14.

Figure 16:
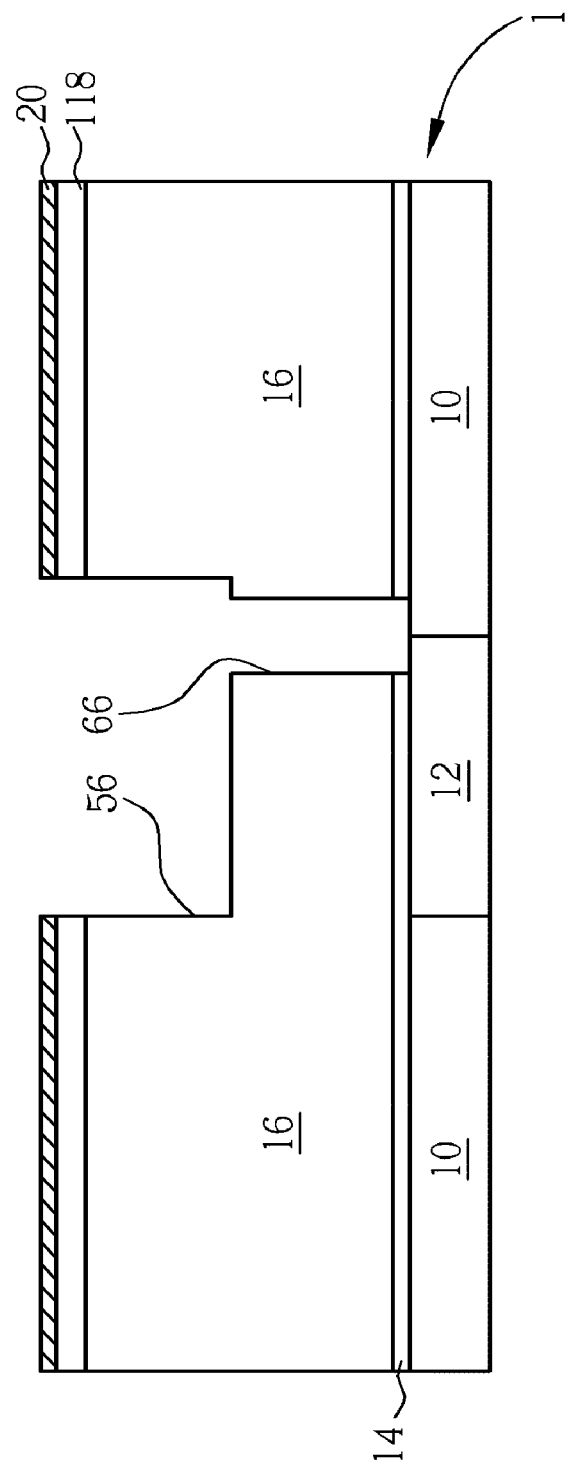

As shown in FIG. 16, another dry etching step or LRM step is carried out to selectively remove the exposed lower cap layer 14 from the via opening 66, thereby exposing a portion of the lower copper wiring 12 and a portion of the low-k dielectric layer 10. It is one salient feature of this invention that the etching of the cap layer 14 has high selectivity to the underlying low-k dielectric layer 10. Therefore, the exposed low-k dielectric layer 10 due to misalignment of the via opening 66 is not recess etched. The undesired recess defect is therefore avoided.

According to the preferred embodiment, the aforesaid dry etching for removing the cap layer 14 utilizes plasma gas mixture source comprising hydrogen-free carbon fluoride such as carbon tetrafluoride ($CF_4$) and nitrogen-containing gas such as nitrogen trifluoride ($NF_3$). The flowrate ratio of $CF_4$ to $NF_3$ is preferably 3:1. For example, the flowrate of $CF_4$ is 150 sccm and the flowrate of $NF_3$ is 50 sccm. According to the preferred embodiment, the $CF_4/NF_3$ plasma can provide high selectivity during the etching of the cap layer 14. The exposed cap layer 14 can be removed rapidly and efficiently, without significantly etching the underlying low-k dielectric layer 10.

It has been experimentally confirmed that merely using the $CF_4$ plasma without incorporating $NF_3$ results in poor selectivity although is can solve the residue problem. When the $CF_4$ plasma (without $NF_3$) is used to etch the cap layer 14 through the misaligned via opening 66, recess defect still forms next to the lower copper wiring 12. Accordingly, to prevent the recess defect, $NF_3$ is critical. It is believed that $NF_3$ in the plasma can provide a thin nitride protection film on the low-k dielectric layer 10 when the cap layer 14 is etched through.

In other preferred embodiments, the dry etching for removing the cap layer 14 may use $CF_4$/NO, $CF_4/NO_2$ or $CF_4/N_2$. However, the plasma containing $CF_4/NH_3$ is not suggested because ammonia contains hydrogen atoms and residues may form during the etching.

Figure 17:
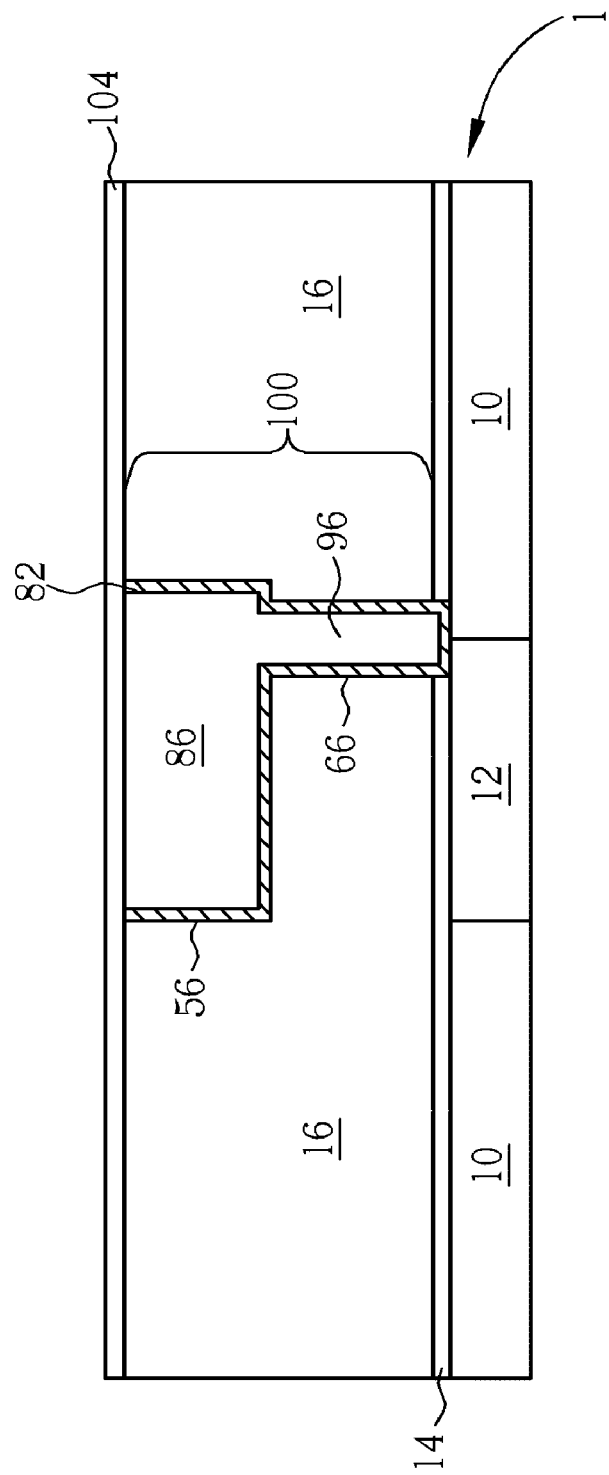

The subsequent steps for forming an upper damascene wiring structure including, for example, deposition of barrier, plating of copper and chemical mechanical polishing (CMP) are known in the art. After the CMP, a dual damascene wiring structure 100 is depicted in FIG. 17. The dual damascene wiring structure 100 includes a barrier layer 82 such as Ti, TiN, Ta or TaN lining the trench opening 56 and the via opening 66, an upper copper wiring 86 inlaid in the trench opening 56, and an integral via plug 96 inlaid in the via opening 66. An upper cap layer 104 such as nitrogen-doped SiC, SiC or SiN is typically deposited on the dual damascene wiring structure 100 and on the exposed surface of the low-k dielectric layer 16.

Figure 18:
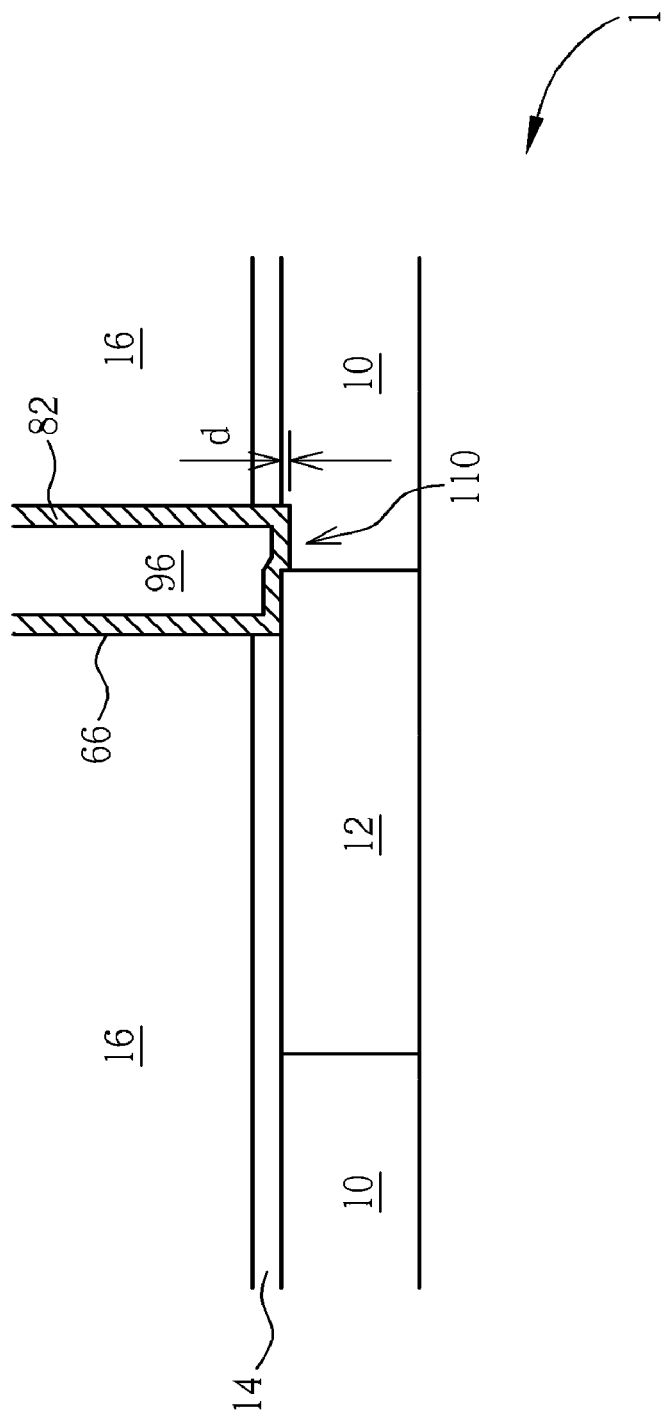
FIG. 18 is an enlarged diagram illustrating the interface between the via plug of the dual damascene wiring structure and the lower copper wiring of FIG. 17.
Figure 19:
FIG. 19 is an SEM image showing the step height that is less than 50 angstroms at the bottom of the via in accordance with this invention.

Please refer to FIG. 18. FIG. 18 is an enlarged diagram illustrating the interface between the via plug 96 of the dual damascene wiring structure 100 and the lower copper wiring 12 of FIG. 17. As shown in FIG. 18, the present invention also provide a dual damascene wiring structure having a via plug 96 that is landing partly on the low-k dielectric layer 10 and partly on the lower copper wiring 12 due to the misalignment between the via opening 66 and the lower copper wiring 12. The cap layer 14 is etched away by employing high selectivity $CF_4/NF_3$ plasma and only a very thin layer of the exposed low-k dielectric layer 10 is removed to form a slightly recessed area 110 that is lower than the top surface of the lower copper wiring 12. The step height d between the top surface of the lower copper wiring 12 and the surface of the slightly recessed area 110 can be well controlled within 150 angstroms. It is critical to control the step height d within 150 angstroms, more preferably less than 50 angstroms, because with such small step height between the top surface of the lower copper wiring 12 and the surface of the slightly recessed area 110, the barrier layer can uniformly deposit in the interior surface of the via opening 66 without generating void defect next to the lower copper wiring 12. FIG. 19 demonstrates an SEM image showing the step height that is less than 50 angstroms at the bottom of the via in accordance with this invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual damascene structure, comprising:
    a substrate comprising thereon a base dielectric layer;
    a lower wiring layer inlaid in the base dielectric layer;
    a cap layer capping the lower wiring layer and the base dielectric layer;
    a dielectric layer on the cap layer;
    a via opening in the dielectric layer and the cap layer, wherein the via opening misaligns with the lower wiring layer thus exposing a portion of the lower wiring layer and a portion of the base dielectric layer, wherein the via opening comprises a bottom including a recessed area, and wherein a step height between the recessed area and a top surface of the lower wiring layer is less than 150 angstroms;
    a barrier layer lining interior surface of the via opening and covers the exposed lower wiring layer and the base dielectric layer, wherein only the barrier layer fills the recessed area; and
    a copper layer filling the via opening on the barrier layer.

2. The dual damascene structure of claim 1 wherein the base dielectric layer comprises organosilicate glass.

3. The dual damascene structure of claim 1 wherein the base dielectric layer comprises C, H-doped silicon oxide dielectric.

4. The dual damascene structure of claim 1 wherein the dielectric layer has a dielectric constant that is less than 3.

5. The dual damascene structure of claim 1 wherein the step height is less than 50 angstroms.

6. The dual damascene structure of claim 1 wherein the cap layer comprises nitrogen doped silicon carbide (SiCN).

7. The dual damascene structure of claim 1 wherein the cap layer comprises SiCN, SiN, SiON, SiC, or SiCO.

8. The dual damascene structure of claim 1 wherein the cap layer has a thickness of 300-800 angstroms.

* * * * *